United States Patent

[11] 3,631,463

[72] Inventor John V. Murphy
Norristown, Pa.
[21] Appl. No. 805,426
[22] Filed Mar. 10, 1969
[45] Patented Dec. 28, 1971
[73] Assignee Sperry Rand Corporation
New York, N.Y.

[54] SELF-CLOCKED ENCODING SCHEME
1 Claim, 10 Drawing Figs.

[52] U.S. Cl. 340/347DD, 325/38 A
[51] Int. Cl. H04l 3/00, H03k 13/24
[50] Field of Search 340/347 DD; 325/38 A; 178/66, 70

[56] References Cited
UNITED STATES PATENTS

| | | | |
|---|---|---|---|
| 3,162,724 | 12/1964 | Ringelhaan | 325/38 UX |
| 3,230,310 | 1/1966 | Brogle | 328/28 UX |
| 3,337,862 | 8/1967 | Croft et al. | 340/347 |
| 3,414,894 | 12/1968 | Jacoby | 340/347 X |
| 3,422,425 | 1/1969 | Vallee | 340/347 |
| 3,505,644 | 4/1970 | Breant | 340/347 X |
| 2,996,578 | 8/1961 | Andrews | 178/70 |

*Primary Examiner*—Maynard R. Wilbur
*Assistant Examiner*—Michael K. Wolensky
*Attorneys*—Charles C. English, William E. Cleaver and Stanley B. Green

ABSTRACT: A binary data translation system is provided wherein the binary data is first fed into a data encoder to produce a unipolar pulse train characteristic of the data to be transmitted and then a converter is used to convert the unipolar pulse train into a three-level bipolar pulse train, thereby to reduce the bandwidth requirements of the system. The encoder and converter operate to provide a self-clocking data translation system.

INVENTOR
John V. Murphy

BY E. E. Englick
AGENT

SELF-CLOCKED ENCODING SCHEME

This invention relates to a pulse signal translation system and in more particular to a binary digital translation system which finds use either in digital magnetic recording devices or communication networks.

Binary digital translation systems of the type to which the present invention pertains are well known in the art. One desirable feature of such a system is the establishment of a high bit rate for a given bandwidth. Another desirable feature of such systems, particularly when they are employed in magnetic recording devices, is that of self-clocking. These features are, however, generally antagonistic to one another, and past designs have provided for one or the other but not both of these features.

It is accordingly an object of this invention to provide a binary digital translation system which has both of the above features.

Brief Summary of the Invention

In accordance with the teachings of this invention the binary data to be transmitted is sent to a pulse modulator for encoding. The pulse modulator according to this invention operates to produce a signal level shift which occurs at a given position in the time period of a clock cycle as determined by the binary bit being represented. For example, in one embodiment the modulator operates to cause a signal level shift to occur at the center of the clock time period if a binary "one" is being represented, or a signal level shift to occur at the boundary of the clock time period if a binary "zero" is being represented. In another embodiment the modulator operates to cause a binary "one" to be represented by producing a signal level shift at both the start and at the midpoint of the clock period and binary "zero" to be represented by producing a single shift at the start of the clock period. The modulator according to this invention thus produces a unipolar pulse train the pulse durations and spacings of which represent the binary data being encoded. This pulse train has a self-clocking characteristic since signal shifts occur essentially every clock period. The unipolar pulse train derived from the modulator is then fed into a converter circuit which operates to convert the pulses thereof into a pulse train having both positive and negative pulse excursions. Specifically, the alternate pulses of the unipolar pulse train from the modulator are transmitted as pulses having the corresponding sense, duration and timing whereas the intermediate pulses of the unipolar pulse train are transmitted as pulses having an inverted sense. The resulting waveform which is bipolar has a high-frequency component which is approximately one-half the frequency of the corresponding highest frequency component of the unipolar pulse train. In other words the data rate for a given bandwidth using the bipolar pulse train is approximately twice the data rate of the corresponding unipolar pulse train. Furthermore, the resulting bipolar pulse train retains its self-clocking characteristic. Moreover, the self-clocking bipolar pulse train can be readily and easily produced by using any one of a number of standard well-known signal shift position modulators in conjunction with any one of a number of simple yet reliable converter circuits.

Other and more specific objects and advantages of this invention will become apparent upon a careful consideration of the following description when taken in conjunction with the accompanying drawings; in which FIG. 1 shows a generalized block diagram of the invention;

Figure 1:
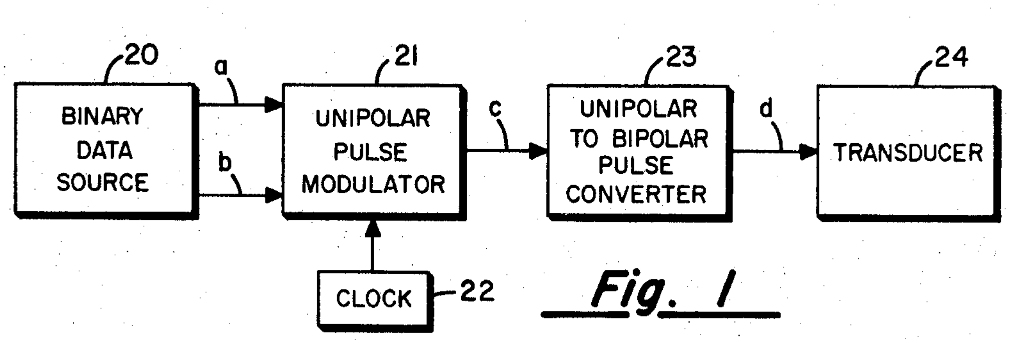
Figure 6:
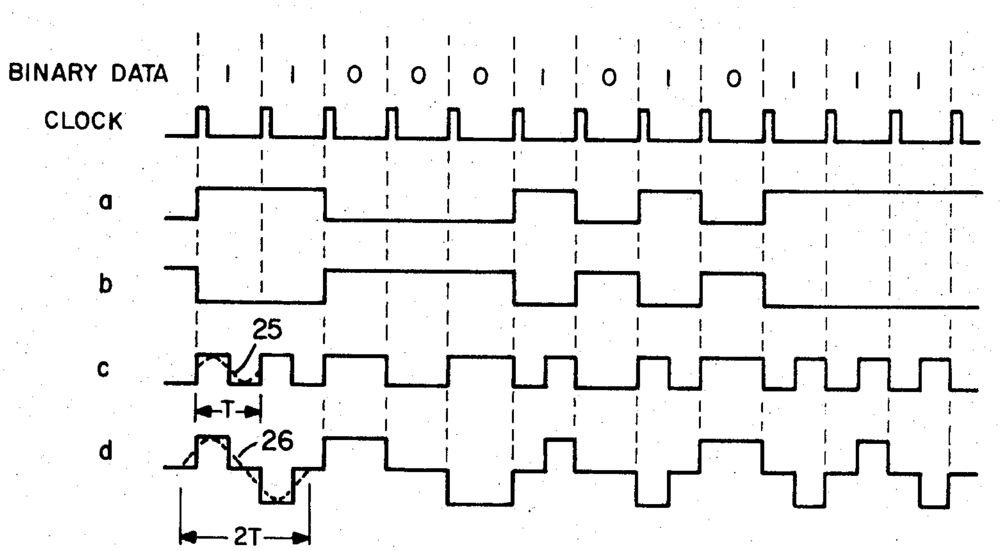
FIG. 6 shows a set of timing diagrams useful in explaining the operation of FIG. 1.

To obtain a more complete understanding of the teachings of the present invention, reference will now be made to FIGS. 1 and 6. In FIG. 1 the block 20 represents a serial binary data source of the nonreturn-to-zero type. In a typical application, block 20 may comprise a flip-flop register or the like which develops on its output lines *a* and *b* an envelope signal such as shown by the waveforms *a* and *b* respectively in FIG. 6. As herein indicated the output line *a* of the data source 20 assumes a relative positive level whenever binary "ones" are being transmitted and line *b* as shown by waveform *b* assumes a relative positive level whenever binary "zeros" are being transmitted. The binary data represented by waveforms *a* and *b* is indicated at the top of FIG. 6.

Figure 5:
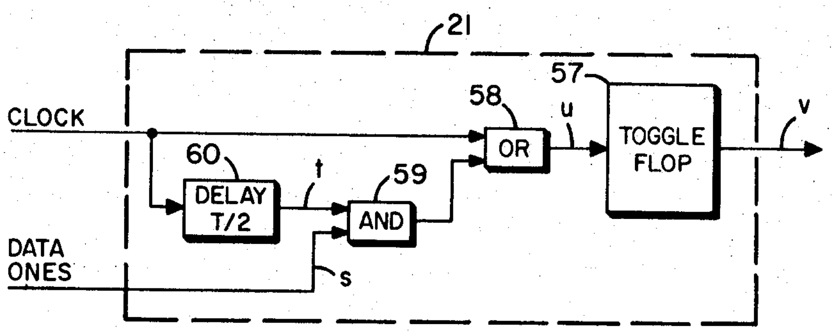
FIG. 5 shows in block diagram form an alternate type of modulator suitable for use in this invention.

The output from the binary data source 20 appearing on lines *a* and *b* is applied to a pulse-encoding modulator circuit 21 along with the pulse output of a clock source 22. The clock circuit 22 is a standard pulse source which produces regularly recurrent pulses as shown by the first waveform of FIG. 6 while the pulse modulator or encoder 21 may also be of standard design as shown in FIG. 5 and as will be described in more detail hereinafter. In a typical application the encoder or modulator 21 includes a circuit, for example, which in response to the clock pulse source 22 produce a voltage shift at the start of each clock period for a binary "zero" and another signal shift at the midpoint of the clock period point if a binary "one" is to be transmitted. In the specific illustration shown in FIG. 6, the modulator circuit 21 thus produces on its output line *c* a unipolar pulse train as shown in waveform *c* for the data represented at the top of FIG. 6. The resulting unipolar pulse train *c* is then applied to a unipolar-to-bipolar pulse converter 23, where the converter 23 operates to produce at its output *d* the pulse train shown by waveform *d* in FIG. 6. As shown by the waveform *d* the first and alternate pulses thereafter of the waveform *c* are transmitted as pulses having corresponding duration and timing to the pulses of waveform *c* whereas the second and alternate pulses thereafter are transmitted in an inverted sense. The resulting waveform, waveform *d*, has a high-frequency component as shown by the dotted sine wave 26 which is one-half the value of the high-frequency component of waveform *c* as shown by the dotted sine wave 25. Thus by comparing the waveforms *c* and *d* it will be seen that the bit rate of waveform *d* for a given bandwidth has been doubled over the bit rate of waveform *c* and also since the waveform *d* shows a signal shift at the beginning of every clock period, the data being represented by waveform *d* is self-clocking. The output *d* of the converter 23 is then finally applied to a transducer 24 which may in the case of a communications network be either a line transmission system or an *rf* source. In the alternative, if the invention is used in a magnetic recording system, transducer 24 may be the write drivers for the magnetic recording head. In the latter case, it is assumed that a linear recording mode would be employed.

Figure 2:
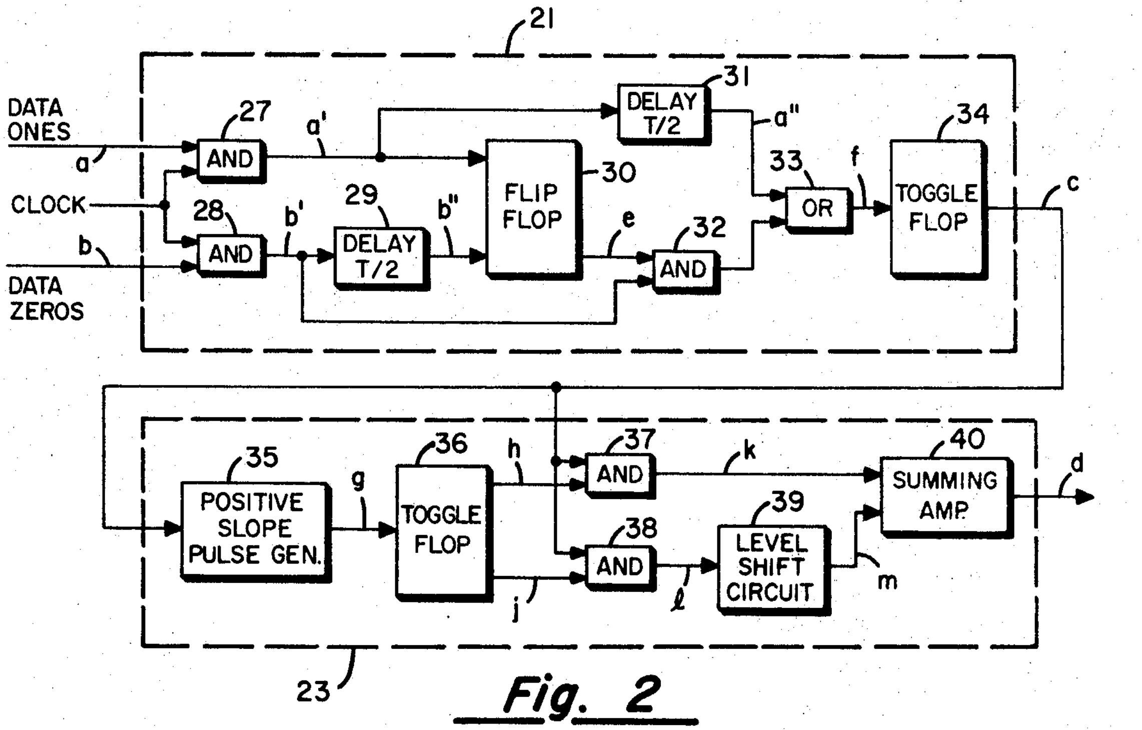
FIG. 2 shows in more detail the modulator and converter circuits of one preferred type of binary digital translation system.

Having described the general theory of operation and organization of the invention, the details of a preferred type of modulator 21 and converter 23 will now be described in connection with FIGS. 2 and 7 to which reference is now made. The modulator 21 shown in FIG. 2 is of well-known design and is arranged to provide a signal shift at the center of a clock time period for each binary "one" to be represented and a signal shift at the start of each time clock period for each binary "zero" to be represented except the first binary "zero" following a binary "one" is deleted. By deleting the first binary "zero" following a binary "one," the high-frequency component of the resulting modulated waveform is further reduced by a factor of two. This further improves the data rate to bandwidth performance of the system.

Figure 7:
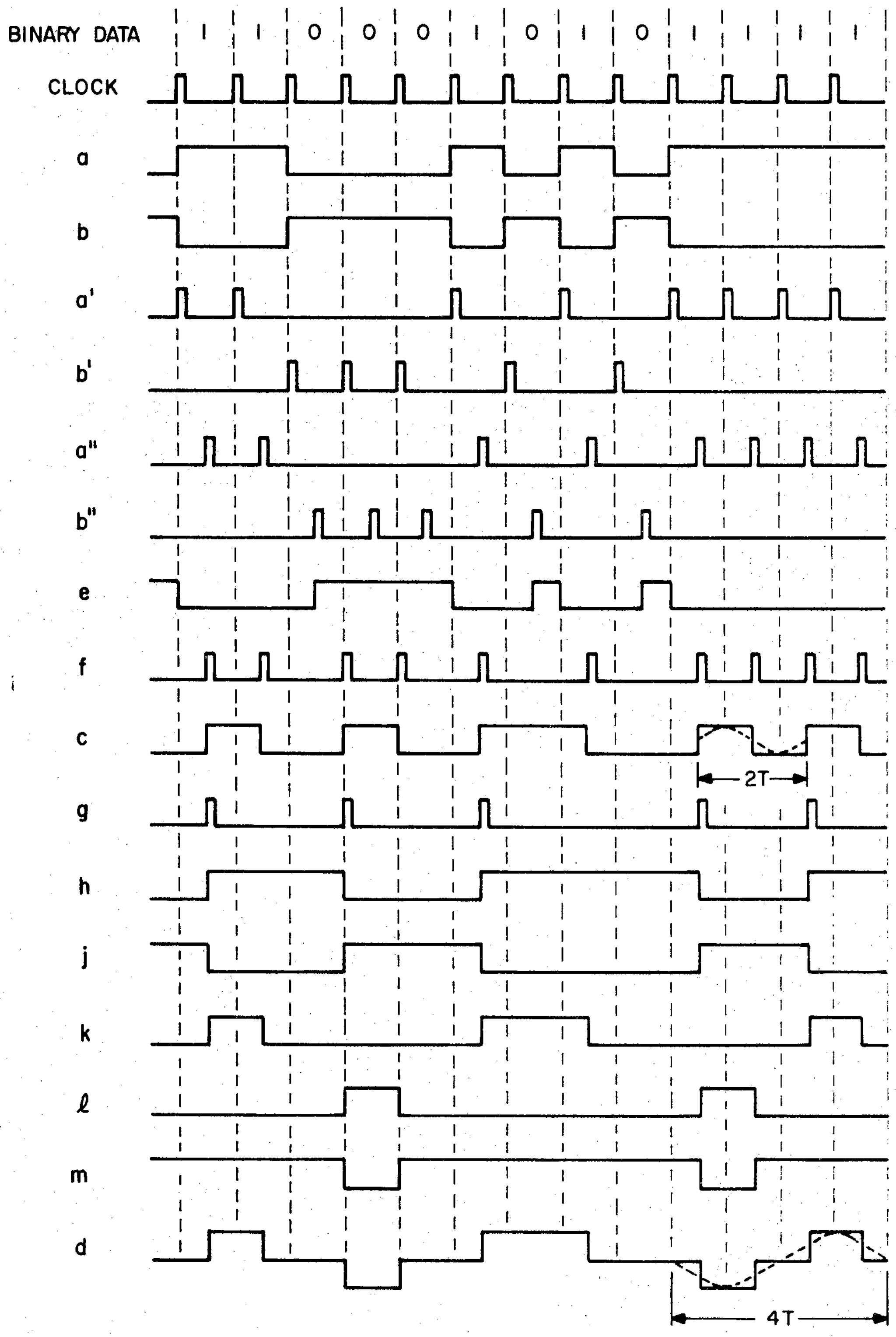
FIG. 7 shows a set of timing diagrams useful for explaining the operation of FIG. 2.

In FIG. 2 the input lines *a* and *b* correspond to the input lines *a* and *b* of FIG. 1, and the corresponding exciting waveforms for the data represented by FIG. 7 is shown by waveforms *a* and *b* respectively. As illustrated in FIG. 2 the input line *a* serves as one input to a two-input "AND"-gate 27 while the input line *b* serves as one input to a two-input "AND"-gate 28. The other two inputs for the "AND"-gates 27 and 28 is derived from a clock source the output of which is represented by the appropriately labeled waveform of FIG. 7. As illustrated by the waveform *a* and *b* in FIG. 7, "AND"-gate 27 is enabled during the times that a binary "one" is being transmitted from the data source while "AND"-gate 28 is enabled whenever a "zero" is being transmitted from the data source. As a result there will appear at the output line *a'* of "AND"-gate 27 a pulse pattern as shown by waveform *a'* in FIG. 7. Similarly, there will appear at the output *b'* of "AND"-gate 28 a pulse pattern as shown by waveform *b'*.

The output of the "AND"-gate 27 is applied to the set input terminal of the flip-flop 30 and also to the input of a delay element 31 which provides a half-clock period delay. The output of the delay element 31 as shown in waveform *a''* is applied to one input of a two-input "OR"-gate 33. The output *b'* of "AND"-gate 28 is applied through a one-half period delay element 29 to the reset input terminal of flip-flop 30 and also directly to one input of a two-input "AND"-gate 32. The other input to gate 32 is obtained from the reset output line *e* of the flip-flop 30. As connected, the flip-flop 30 is set by the binary "one" output *a'* from "AND"-gate 27 and is reset by the delayed binary "zero" output *b''* from "AND"-gate 28. With this interconnection the reset output of the flip-flop 30 as shown by waveform *e* acts to disable the "AND"-gate 32 after the receipt of each binary "one" input and to enable the "AND"-gate 32 one-half period after the production of a binary "zero" pulse of waveform *b'*. *In this way "AND"-gate 32 will produce an output pulse for each binary "zero" except for the first binary "zero" following a binary "one."*

The output from "AND"-gate 32 is applied as the other input to the "OR"-gate 33 which produces on its output line *f* a pulse pattern corresponding to waveform *f* of FIG. 7. The output from the "OR"-gate 33 is applied to the trigger input of a toggle flop 34 (triggerable flip-flop) which in turn produces the output shown by waveform *c*. As indicated by the output *c* of toggle flop 34 there is produced a signal shift at the center of each clock period for each binary "one" and a signal shift at the start of each clock period for a binary "zero" except for a binary "zero" which immediately follows a binary "one." The output *c* of toggle flop 34 thus corresponds to the encoded unipolar waveform of the modulator and this waveform will now be converted by the converter 23 into a bipolar waveform as shown in waveform *d* of FIG. 7.

The converter 23 includes at its input a positive slope pulse generator 35 which generates on its output *g* a single pulse for each positive voltage shift of waveform *c*. Such circuits are well known in the art and may include, for example, a differentiating and rectifying circuit. The output *g* of the positive slope generator 35 is applied to the trigger input of a toggle flop 36 which generates on its set and reset output lines *h* and *j* the signals shown by the waveform *h* and *j* of FIG. 7. These outputs are applied respectively as one input to a pair of input "AND"-gates 37 and 38 which receive at their other inputs the output *c* from the toggle flop 34. The "AND"-gates 37 and 38 in connection with toggle flop 36 operate as a commutator or distributor to distribute to the output lines *k* and *l* of the "AND"-gates 37 and 38 the alternate pulses of waveform *c*. In other words the output from "AND"-gate 37 will comprise the alternate pulses of waveform *c* whereas the output appearing on line *l* of gate 38 will comprise the intermediate pulses of waveform *c*. The output *l* from "AND"-gate 38 is then applied through a conventional level shift or inverting circuit to produce the inverted signal shown by waveform *m*. This signal together with the output from gate 37 (waveform *k*) is applied to the input of a summing amplifier 40 which sums the input signals to produce at its output the bipolar output signal represented by waveform *d*. A comparison of the bipolar waveform *d* and the dashed sine wave shown therein with the unipolar waveform *c* and the dashed sine wave therein will again show that the high-frequency components of the latter waveform (waveform *d*) are half the value of the high-frequency components shown by waveform *c* thus doubling the data rate for a given bandwidth. Also it will be noted that the signal shifts of waveform *c* are preserved in waveform *d* so that the self-clocking feature of the modulator 21 has not been destroyed.

Figure 3:
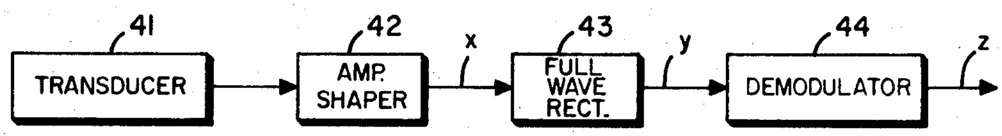
FIG. 3 shows in block diagram form a signal recovery system for the system of FIG. 2.
Figure 8:
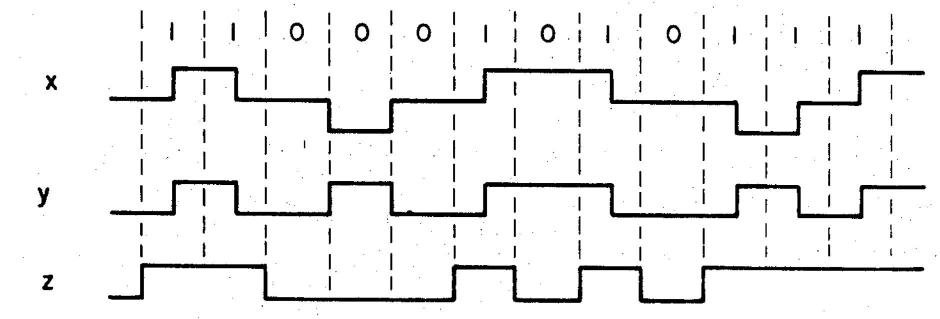
FIG. 8 shows a set of timing diagrams useful in explaining the operation of the recovery system of FIG. 3.

The recovery system for the encoded data produced by FIG. 2 is conventional and one typical arrangement is shown diagrammatically in FIG. 3 to which reference is now made in conjunction with FIG. 8. In this figure (FIG. 3) the transducer 41 may be a magnetic read head in the case where the data of waveform *d* (FIG. 7) is linearly recorded on magnetic tape. The output from the transducer is fed to a conventional amplifier and shaper circuit 42 which produces at its output X a signal corresponding to waveform X of FIG. 8. The output from the amplifier and shaper circuit 42 is then fed to a full wave rectifier circuit 43 which produces at its output Y the signal shown by waveform Y. The output Y from the full wave rectifier circuit 42 is finally fed to a demodulator circuit 44 which in turn reproduces at its output *z* the signal shown by waveform *z* of FIG. 8. The demodulator circuit 44 like the other circuit components of FIG. 3 is of known design and its purpose is to restore the information represented by waveform *a* of FIG. 7 to its original form as shown by waveform *z* of FIG. 8.

Figure 4:
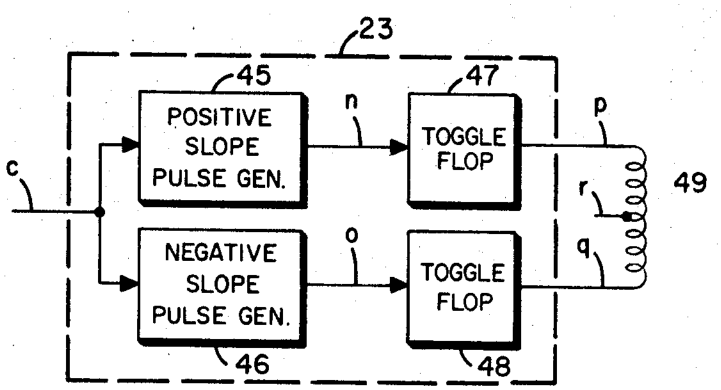
FIG. 4 shows in block diagram form an alternate type of converter suitable for use in this invention.

The converter 23 like the modulator 21 may take many forms and one alternate form for the converter is shown in FIG. 4. As shown in this figure the converter may comprise a positive slope pulse generator 45, a negative slope pulse generator 46 and a pair of toggle flops 47 and 48. The outputs from the toggle flops 47 and 48 are coupled for example to the opposite ends of a magnetic recording head 49. For purposes of simplification the AC biasing circuits and connections for linear recording have not been illustrated.

Figure 9:
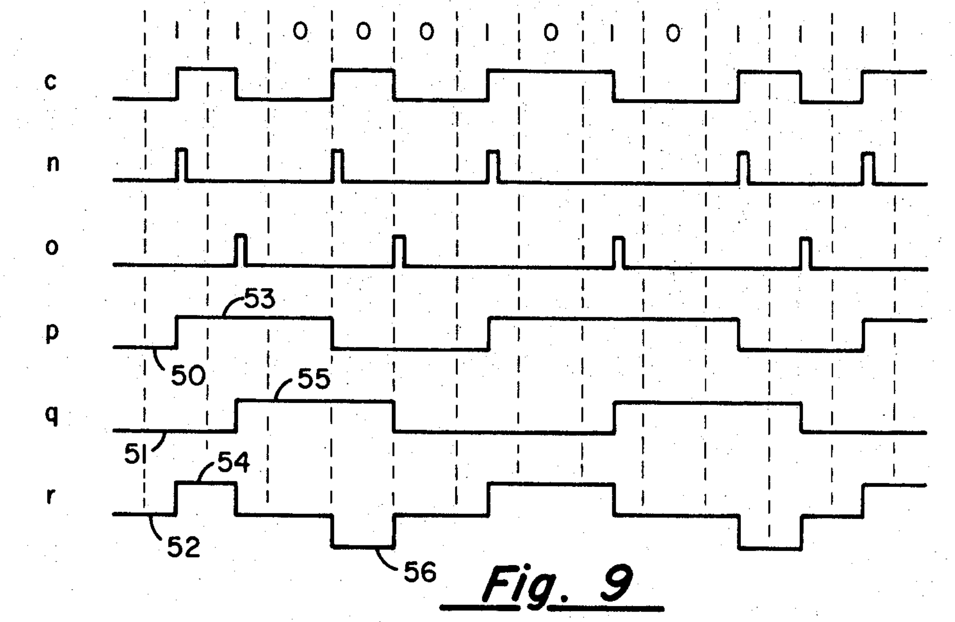
FIG. 9 shows a set of timing diagrams useful in explaining the operation of FIG. 4.

In this embodiment, the coded output of the modulator 21 which is shown by the waveform *c* of FIG. 9 is applied in parallel to the positive and negative slope pulse generators 45 and 46. The generator 45 generates at its output a pulse as shown by waveform *n* for each positive going excursion of the waveform *c*. Similarly the generator 46 generates at its output *o* as shown by waveform *o* a pulse for each negative going excursion of the waveform *c*. The outputs *n* and *o* from the generators 45 and 46 are then applied to the trigger inputs of the respective toggle flops 47 and 48 to produce at their outputs *p* and *q* the waveforms shown at *p* and *q* of FIG. 9. In more particular, it is assumed that prior to the start of the signal pattern of waveform *c* the toggle flops 47 and 48 have been set to similar states as shown at 50 and 51 in waveforms *p* and *q*. During this time no current flows through the write head 49 as indicated by the signal level 52 of waveform *r*. (Waveform *r* represents the effective current flowing through head 49). During the first clock period a trigger pulse is produced at the output *n* of generator 45 to set toggle flop 47 to its opposite state as shown at 53 in waveform *p*. When this occurs a current is caused to flow in one direction through winding 49 as shown at 54 in waveform *r*. During the second clock period a trigger pulse is produced at the output *o* of generator 46. This pulse sets toggle flop 48 to its opposite state as shown at 55 in waveform *q*. This action terminates the current flow through the head winding 49 as shown in waveform *r*. At the start of the fourth clock period a second pulse is generated at the output *n* of generator 45 returning toggle flop 47 to its original state as shown by waveform *p*. This causes a current to flow through winding 49 in the opposite direction as shown at 56 in waveform *r*. Then at the start of the fifth clock interval an output pulse is produced at the output *o* from generator 46 as shown in waveform *o*. This pulse returns toggle flop 48 to its original state and thereby again stops the current flow through head winding 49 again as shown by waveform *r*. Thus a comparison of waveforms *c* and *r* reveals that the circuit of FIG. 4 operates to convert the unipolar pulse train of waveform *c* into a bipolar pulse train having the desired characteristics of being self-clocking and double the bit rate for a given bandwidth.

Figure 10:
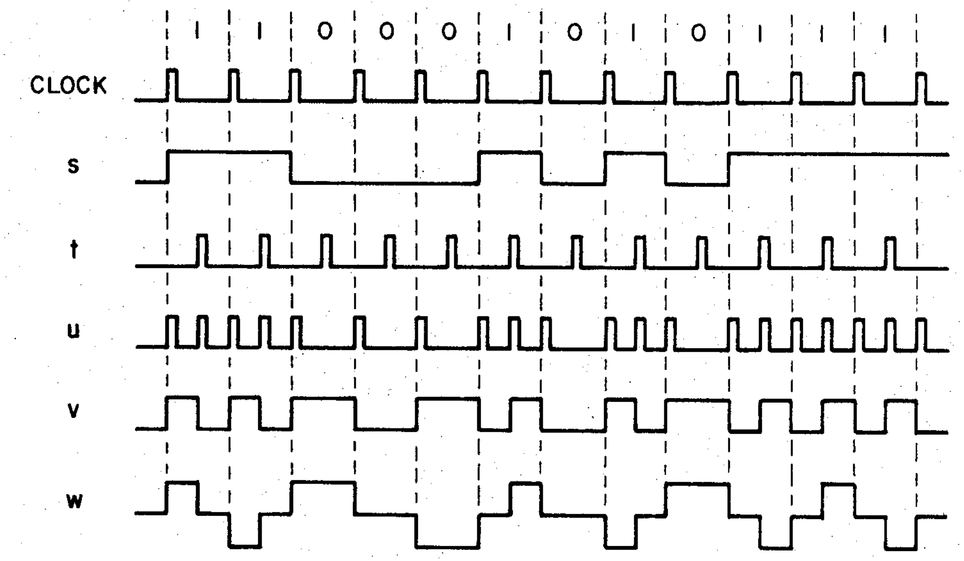
FIG. 10 shows a set of timing diagrams useful in explaining the operation of the modulator shown in FIg. 5.

Also as previously indicated, the modulator 21 may take many alternate forms and one such alternate form is shown in FIG. 5. This circuit operates to produce a single signal shift at the boundary of a clock period from a binary "zero" and a signal shift at both the boundary and at the midpoint of a clock period for a binary "one." The operation of this circuit is illustrated by the waveforms shown in FIG. 10 to which reference is now made in conjunction with FIG. 5. As shown in FIG. 5, the circuit includes a toggle flop 57 which is triggered each clock period by a clock pulse fed through an "OR"-gate 58 to the trigger input of the toggle flop 57. In addition the clock pulse passes through a one-half period delay 60 to an "AND"-gate 59 which gate also receives as an input the nonreturn-to-zero binary "ones" input from the data source to be transmitted. These inputs to gates 59 are shown at *s* and *t* in FIG. 10. The output from gate 59 is then applied to the "OR"-gate 58 which produces the output shown at *u* in FIG. 10. The toggle flop 57 then yields on its output line *y* the output waveform *v* which has the above defined characteristics. This signal may then be applied to one of the foregoing converters to produce the bipolar waveform shown at *w* in FIG. 10.

What is claimed is:

1. In combination: a binary data encoder operable to provide a self-clocked unipolar data output signal, and a unipolar-to-bipolar signal converter coupled to the output of said encoder; said encoder comprising means for generating signal pulses of one phase for binary "zeros" and of a second phase for binary "ones," and a first toggle flip-flop having a triggering input coupled to receive said signal pulses and to change states with each received signal pulse whereby a self-clocked unipolar data signal is developed at the output of said first flip-flop; said unipolar-to-bipolar signal converter comprising a pair of signal paths one of which is operable to provide an inverted output signal relative to the other, a pair of gates coupling the output of said first toggle flip-flop to respective ones of said pair of signal paths, a second toggle flip-flop the input of which is coupled to the output of said first toggle flip-flop and the output of which is coupled to said gates to condition said gates in sequential alternation at the cycling rate of said first toggle flip-flop, and signal output means for combining the signal outputs from said paths.

* * * * *